(12) United States Patent
Kim et al.

(10) Patent No.: US 9,338,929 B2
(45) Date of Patent: May 10, 2016

(54) JUNCTION BOX FOR VEHICLE

(71) Applicants: Hyundai Motor Company, Seoul (KR); Kia Motors Corporation, Seoul (KR); Yura Corporation Co., Ltd., Seongnam, Gyeonggi-Do (KR)

(72) Inventors: Mun Jong Kim, Gyeonggi-Do (KR); Jin Su Yeom, Gyeonggi-Do (KR)

(73) Assignees: Hyundai Motor Company, Seoul (KR); Kia Motors Corporation, Seoul (KR); Yura Corporation Co., Ltd., Seongnam, Gyeonggi-do (KR)

( * ) Notice: Subject to any disclaimer, the term of this patent is extended or adjusted under 35 U.S.C. 154(b) by 7 days.

(21) Appl. No.: 14/543,972

(22) Filed: Nov. 18, 2014

(65) Prior Publication Data
US 2015/0181755 A1 Jun. 25, 2015

(30) Foreign Application Priority Data
Dec. 20, 2013 (KR) .................. 10-2013-0160440

(51) Int. Cl.
*H05K 7/20* (2006.01)
*H02G 3/08* (2006.01)
*B60R 16/02* (2006.01)
*H02B 1/26* (2006.01)

(52) U.S. Cl.
CPC ............ *H05K 7/209* (2013.01); *B60R 16/02* (2013.01); *H02G 3/081* (2013.01); *H02G 3/088* (2013.01)

(58) Field of Classification Search
CPC ........ H05K 7/20; H05K 7/209; H05K 7/026; H05K 1/00; H05K 1/02; H05K 1/18; H05K 1/0203; H05K 1/204; H05K 1/207; G06F 1/20; H01R 9/226; B60R 16/0238; H02G 3/08; H02G 3/081; H02B 1/26; H02B 1/28; H02B 1/56

USPC ............... 361/679.46, 679.54, 626, 688, 361/704–712, 714, 715, 719–724, 728; 165/80.2, 80.3, 104.33, 185, 121–126; 174/50, 50.02, 252–258, 520, 68.2, 174/72 B, 526; 257/706–713, 718–723

See application file for complete search history.

(56) References Cited

U.S. PATENT DOCUMENTS

| | | | | |
|---|---|---|---|---|
| 7,154,753 | B2 * | 12/2006 | Kobayashi | H05K 1/0203 257/706 |
| 7,288,717 | B1 | 10/2007 | Lee | |
| 7,408,765 | B2 * | 8/2008 | Kanou | H05K 7/026 361/622 |
| 7,505,283 | B2 * | 3/2009 | Naimi | H05K 3/0064 174/50 |
| 7,733,632 | B2 * | 6/2010 | Ito | H01H 50/021 174/520 |
| 8,416,575 | B2 * | 4/2013 | Sato | H01R 9/226 174/260 |

(Continued)

FOREIGN PATENT DOCUMENTS

| | | | | |
|---|---|---|---|---|
| GB | 2403603 | A * | 1/2005 | ............. H05K 7/142 |
| JP | 2006136147 | A * | 5/2006 | ............... H02G 3/16 |

(Continued)

*Primary Examiner* — Michail V Datskovskiy
(74) *Attorney, Agent, or Firm* — Mintz Levin Cohn Ferris Glovsky and Popeo, P.C.; Peter F. Corless

(57) ABSTRACT

A junction box for a vehicle is provided. The junction box includes at least one printed circuit board having a metal core and a heat transfer member formed at an edge of the printed circuit board. In addition, the junction box includes a case in which at least one printed circuit board is disposed. Further, the heat transfer member contacts the inner surface of the case.

5 Claims, 5 Drawing Sheets

(56) References Cited

U.S. PATENT DOCUMENTS

| | | | |
|---|---|---|---|
| 8,436,250 B2* | 5/2013 | Takahashi | H01L 23/142 174/255 |
| 9,232,629 B2* | 1/2016 | Jingama | H05K 1/0203 |
| 2004/0159455 A1* | 8/2004 | Onizuka | H05K 7/026 174/50 |
| 2004/0223304 A1* | 11/2004 | Kobayashi | B60R 16/0238 361/715 |
| 2007/0212529 A1* | 9/2007 | Cho | B32B 15/08 428/209 |
| 2007/0279870 A1* | 12/2007 | Sato | H01R 9/226 361/704 |
| 2007/0279871 A1* | 12/2007 | Ishida | H05K 1/0204 361/704 |
| 2010/0294561 A1* | 11/2010 | Sawai | H05K 1/0207 174/520 |

FOREIGN PATENT DOCUMENTS

| | | |
|---|---|---|
| JP | 2010-141133 A | 6/2010 |
| KR | 10-1116881 B1 | 2/2012 |
| KR | 10-2012-0037670 A | 4/2012 |

* cited by examiner

JUNCTION BOX FOR VEHICLE

CROSS-REFERENCE TO RELATED APPLICATION

This application claims priority to and the benefit of Korean Patent Application No. 10-2013-0160440 filed in the Korean Intellectual Property Office on Dec. 20, 2013, the entire contents of which are incorporated herein by reference.

BACKGROUND (a) Field of the Invention

The present invention relates to a junction box for a vehicle, and more particularly, to a junction box for a vehicle that includes a heat dissipation printed circuit board to improve a heat dissipation characteristic.

(b) Description of the Related Art

In general, a junction box installed within an engine room of a vehicle, as an apparatus for distributing power using a relay and a fuse, is configured to supply the power to components of the vehicle and interrupt the power when an error occurs to protect the components. The junction box is a type of electric supply box having an electric supply function of a wire harness in which various components such as a fuse and a relay are combined between circuits to be embedded within the box, and has a structure in which a printed circuit board (PCB) with a circuit pattern is installed within a cover.

The printed circuit board of the junction box includes a plurality of conductive patterns formed according to a designed circuit pattern, and thus high-temperature heat is radiated according to the conductive pattern and a mounted or embedded element. However, when heat of a predetermined level or greater is generated from the mounted or embedded element, an error such as a malfunction or damage occurs in the circuit, and as a result, to radiate the heat generated from the mounted or embedded element, a printed circuit board in which a copper (Cu) core is inserted into the center of the substrate and the circuit pattern is made of copper (Cu) has been used. However, the temperature of the printed circuit board may be saturated by heat absorbed by the copper (Cu) core to be increased.

The above information disclosed in this section is merely for enhancement of understanding of the background of the invention and therefore it may contain information that does not form the prior art that is already known in this country to a person of ordinary skill in the art.

SUMMARY

The present invention provides a junction box for a vehicle that may prevent heating of components and printed circuit boards by heat to stabilize an operation of a component and extend a lifespan thereof.

An exemplary embodiment of the present invention provides a junction box for a vehicle that may include: at least one printed circuit board including a metal core; a heat transfer member formed at an edge of the printed circuit board; and a case in which at least one printed circuit board is positioned and of which the heat transfer member contacts the inner surface.

The printed circuit board may include insulating layers formed on both sides of the metal core, a first circuit pattern formed on the insulating layer, and a second circuit pattern formed on the first circuit pattern, and the heat transfer member may contact (e.g. may be disposed adjacent to or in contact with) the side of the metal core. The metal core, the first circuit pattern, and the case may include aluminum. The second circuit pattern and the heat transfer member may include copper. The printed circuit board may include a lower printed circuit board and an upper printed circuit board. In addition, the case may include a lower case and an upper case, the heat transfer member formed on the lower printed circuit board may contact the inner surface of the lower case, and the heat transfer member formed on the upper printed circuit board may contact the inner surface of the upper case.

According to the exemplary embodiment of the present invention, a heat transfer member may be formed at an edge of the printed circuit board including a metal core and the heat transfer member may contact the metal core and an inner surface of a case to emit the heat generated from the printed circuit board to the exterior, to thus prevent overheating of the printed circuit board. As a result, it may be possible to stabilize an operation of a component and extend a lifespan thereof. Further, the metal core and the circuit pattern of the printed circuit board may be formed of aluminum to minimize weight and maximize heat dissipation.

BRIEF DESCRIPTION OF THE DRAWINGS

The drawings are to reference in describing exemplary embodiment of the present invention, and the technical scope of the present invention is not interpreted to be limited to the accompanying drawings.

DETAILED DESCRIPTION

Figure 1:
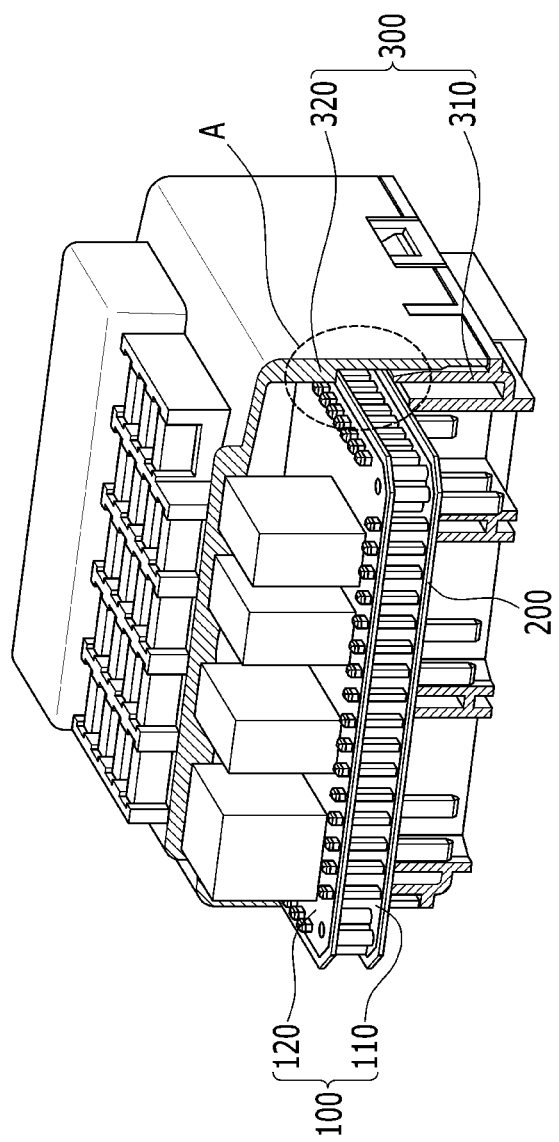
FIG. 1 is an exemplary detailed view of a junction box for a vehicle according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

The present invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention.

Accordingly, the drawings and description are to be regarded as illustrative in nature and not restrictive. Like reference numerals designate like elements throughout the specification. In addition, the size and thickness of each configuration shown in the drawings are arbitrarily shown for better understanding and ease of description, but the present invention is not limited thereto.

Figure 2:
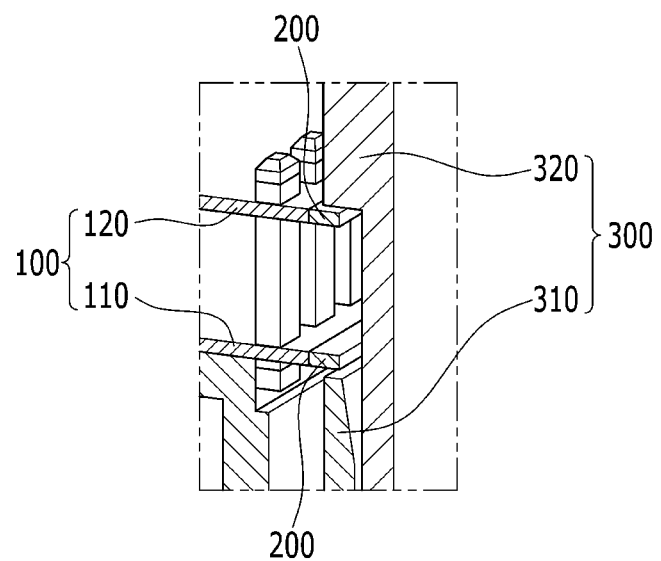
FIG. 2 is an exemplary detailed view of a portion A of FIG. 1 according to an exemplary embodiment of the present invention.
Figure 3:
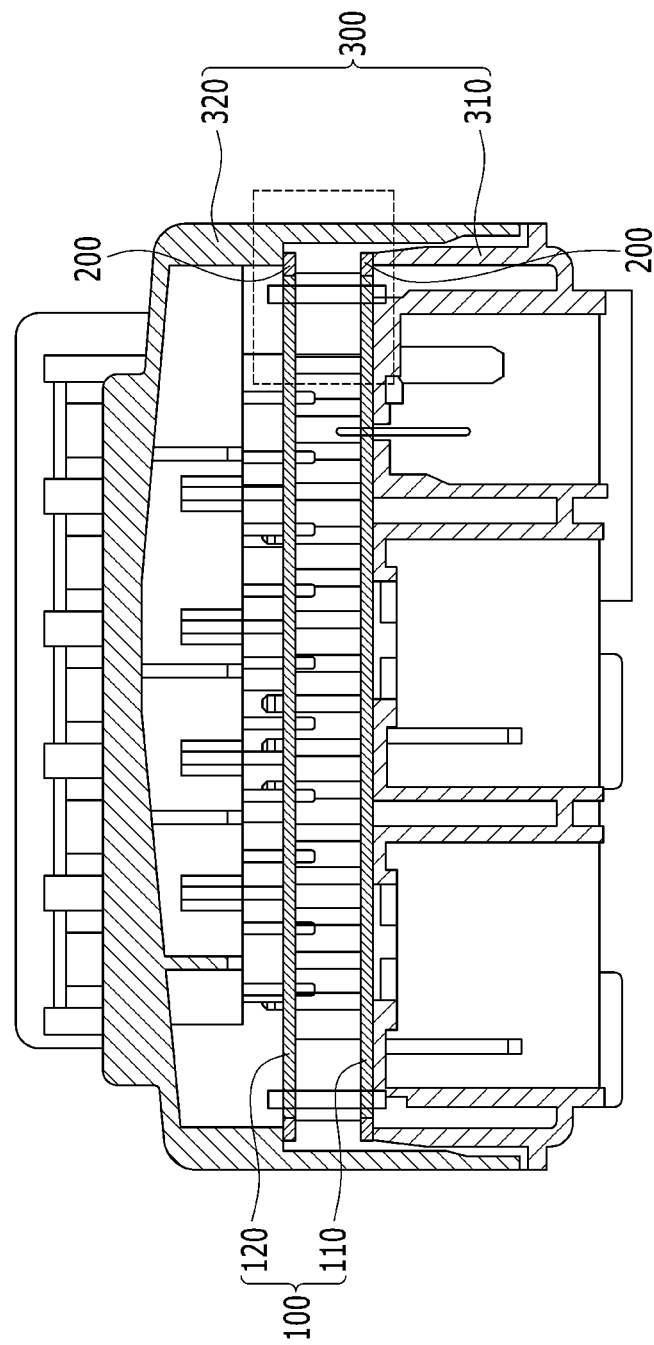
FIG. 3 is an exemplary cross-sectional view of the junction box for a vehicle according to the exemplary embodiment of the present invention.
Figure 4:
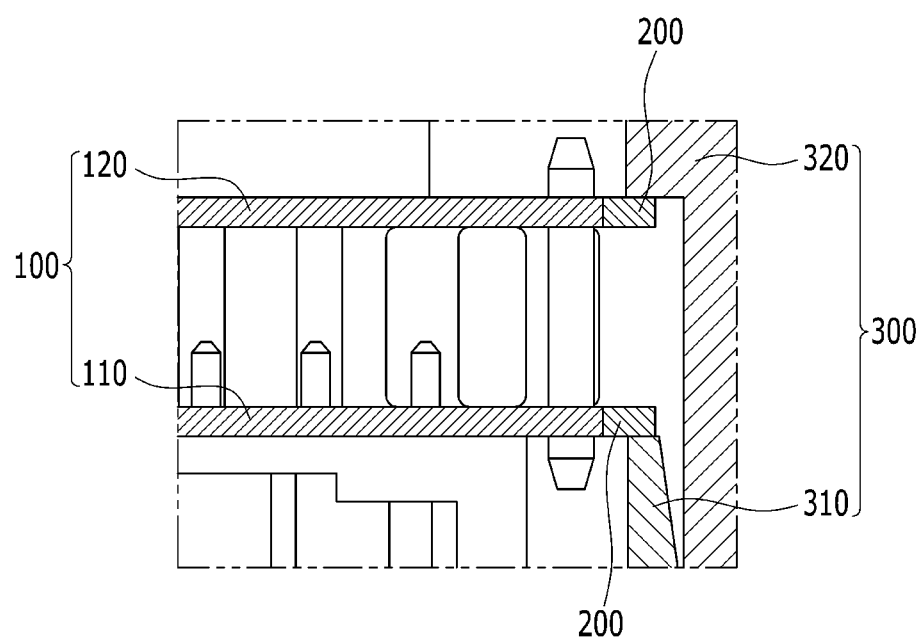
FIG. 4 is an exemplary detailed cross-sectional view of a portion B of FIG. 3 according to an exemplary embodiment of the present invention.
Figure 5:
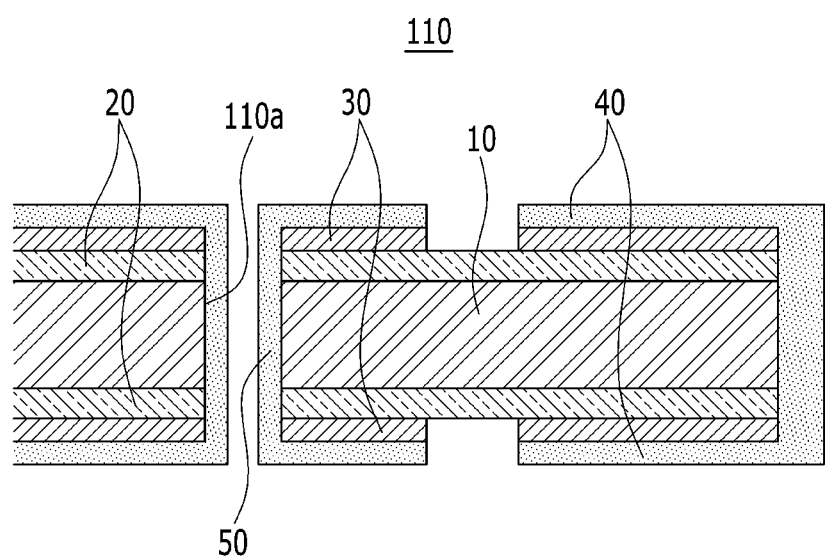
FIG. 5 is an exemplary cross-sectional view of a printed circuit board of the junction box for a vehicle according to the exemplary embodiment of the present invention.

FIG. 1 is an exemplary detailed view of a junction box for a vehicle according to an exemplary embodiment of the present invention, FIG. 2 is an exemplary detailed view of a portion A of FIG. 1, FIG. 3 is an exemplary cross-sectional view of the junction box for a vehicle, FIG. 4 is an exemplary detailed cross-sectional view of a portion B of FIG. 3, and FIG. 5 is an exemplary cross-sectional view of a printed circuit board of the junction box for a vehicle.

As illustrated in FIGS. 1 to 5, the junction box for a vehicle according to an exemplary embodiment of the present invention may include at least one printed circuit board 100, a heat transfer member 200 formed at an edge of the printed circuit board 100, and a case 300 into which at least one printed circuit board 100 may be disposed. In the exemplary embodiment of the present invention, the printed circuit board 100 may include a lower printed circuit board 110 and an upper printed circuit board 120, but is not limited thereto and various exemplary embodiments are possible.

As illustrated in FIG. 5, the lower printed circuit board 110 may include a plurality of insulating layers 20 formed on both sides of a metal core 10, a first circuit pattern 30 formed on the insulating layer 20, and a second circuit pattern 40 formed on the first circuit pattern 30 with the same pattern as the first circuit pattern 30. The lower printed circuit board 110 may include a via aperture 110a that passes through the metal core 10, the insulating layer 20, and the first circuit pattern 30.

The metal core 10 and the first circuit pattern 30 may be formed of aluminum to minimize weight of the lower printed circuit board 110 and maximize heat dissipation, and the case 300 may be formed of aluminum to minimize weight of the junction box for a vehicle and maximize heat dissipation. The insulating layer 20 may be configured to insulate the metal core 10 and the first circuit pattern 30 from each other, and an inner wall metal layer 50 may be formed with the same material as the second circuit pattern 40 on the inner wall of the via aperture 100a to electrically connect the first circuit pattern 30 formed on the upper surface of the lower printed circuit board 110 and the first circuit pattern 30 formed on the lower surface of the lower printed circuit board 110.

To form the first circuit pattern 30 made from aluminum, since an etching speed of aluminum is greater than an etching speed of copper by approximately 600%, an acid-based etchant using, e.g., hydrochloric acid (HCL) or sulfuric acid ($H_2SO_4$) may be used. The heat transfer member 200 may be formed to contact the side of the metal core 10, and may be formed of copper to maximize heat dissipation. The second circuit pattern 40, the inner wall metal layer 50, and the heat transfer member 200 may be simultaneously formed using a copper plating process. In particular, to prevent the first circuit pattern 30 and the metal core 10 including aluminum from being etched by a copper plating solution, a zincate processing method in which copper plating is performed after plating zinc on aluminum may be used.

Since the upper printed circuit board 120 is substantially the same as the lower printed circuit board 110, the duplicated description is omitted. Further, the case 300 may include a lower case 310 and an upper case 320 coupled with each other. The heat transfer member 200 formed on the lower printed circuit board 110 may contact the inner surface of the lower case 310, and the heat transfer member 200 formed on the upper printed circuit board may contact the inner surface of the upper case 320.

Accordingly, the heat transfer member 200 may be formed at an edge of the printed circuit board 100 including the metal core 10 and the heat transfer member 200 may contact the metal core 10 and the inner surface of the case 300 to discharge the heat generated from the printed circuit board by heat absorbed by the metal core 10 to the exterior, to thus prevent overheating of the printed circuit board. As a result, it may be possible to stabilize an operation of a component and extend a lifespan thereof. Further, the metal core 10 and the circuit pattern of the printed circuit board may be made of aluminum to minimize weight of the printed circuit board and maximize heat dissipation.

While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: Printed circuit board
200: Heat transfer member
300: Case

What is claimed is:

1. A junction box for a vehicle, comprising:
   at least one printed circuit board including a metal core;
   a heat transfer member formed at an edge of the printed circuit board; and
   a case in which at least one printed circuit board is disposed,
   wherein the heat transfer member contacts the inner surface of the case.

2. The junction box for a vehicle of claim 1, wherein the printed circuit board includes:
   a plurality of insulating layers formed on both sides of the metal core;
   a first circuit pattern formed on the insulating layer; and
   a second circuit pattern formed on the first circuit pattern,
   wherein the heat transfer member contacts the side of the metal core.

3. The junction box for a vehicle of claim 2, wherein the metal core, the first circuit pattern, and the case are formed of aluminum.

4. The junction box for a vehicle of claim 2, wherein the second circuit pattern and the heat transfer member are formed of copper.

5. The junction box for a vehicle of claim 2, wherein the printed circuit board includes a lower printed circuit board and an upper printed circuit board, the case includes a lower case and an upper case, the heat transfer member formed on the lower printed circuit board contacts the inner surface of the lower case, and the heat transfer member formed on the upper printed circuit board contacts the inner surface of the upper case.

\* \* \* \* \*